(12) United States Patent
Kawai

(10) Patent No.: US 11,698,400 B2
(45) Date of Patent: Jul. 11, 2023

(54) ELECTRONIC CIRCUIT

(71) Applicant: KABUSHIKI KAISHA TOSHIBA, Minato-ku (JP)

(72) Inventor: Shusuke Kawai, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 476 days.

(21) Appl. No.: 16/810,905

(22) Filed: Mar. 6, 2020

(65) Prior Publication Data

US 2021/0072297 A1    Mar. 11, 2021

(30) Foreign Application Priority Data

Sep. 9, 2019    (JP) .................................. 2019-163985

(51) Int. Cl.
  *G01R 27/16*    (2006.01)
  *G01K 7/32*    (2006.01)
  *H03M 1/12*    (2006.01)

(52) U.S. Cl.
  CPC ............... *G01R 27/16* (2013.01); *G01K 7/32* (2013.01); *G01K 2217/00* (2013.01); *H03M 1/12* (2013.01)

(58) Field of Classification Search
  CPC .......... G01R 27/16; G01R 27/02; G01K 7/32; H03M 1/12
  See application file for complete search history.

(56) References Cited

U.S. PATENT DOCUMENTS

| 5,432,451 | A | * | 7/1995 | McGill | ............... | G01R 33/3628 |
|     |   |   |        |         |                | 324/318 |
| 5,796,231 | A | * | 8/1998 | Kyodo | ................. | H02P 6/183 |
|     |   |   |        |         |                | 318/632 |
| 7,511,537 | B2 |  | 3/2009 | Kimura |  |  |
| 8,330,499 | B2 |  | 12/2012 | Hirose et al. |  |  |
| 8,598,914 | B2 |  | 12/2013 | Nishijima et al. |  |  |
| 8,884,653 | B2 |  | 11/2014 | Inoue |  |  |
| 9,244,102 | B2 |  | 1/2016 | Kikuchi |  |  |
| 2002/0158623 | A1 | * | 10/2002 | Mercier | ................. | G01R 19/04 |
|     |   |   |        |         |                | 324/118 |
| 2012/0306553 | A1 | * | 12/2012 | Kim | ..................... | G04F 10/005 |
|     |   |   |        |         |                | 374/170 |
| 2015/0222306 | A1 | * | 8/2015 | Nagai | .................. | H03K 17/691 |
|     |   |   |        |         |                | 455/298 |

(Continued)

FOREIGN PATENT DOCUMENTS

JP    2008-118545 A    5/2008
JP    2011-182188 A    9/2011

(Continued)

OTHER PUBLICATIONS

U.S. Appl. No. 16/290,080, filed Mar. 1, 2019, Kawai.

(Continued)

*Primary Examiner* — Christopher P McAndrew
*Assistant Examiner* — Zannatul Ferdous
(74) *Attorney, Agent, or Firm* — Oblon, McClelland, Maier & Neustadt, L.L.P.

(57) ABSTRACT

According to one embodiment, an electronic circuit includes an oscillator and a measuring circuit. The oscillator generates a first signal with a frequency corresponding to a time. The measuring circuit measures a first voltage based on a resonance frequency in a terminal of a semiconductor device where the first signal is supplied.

19 Claims, 12 Drawing Sheets

100:ELECTRONIC CIRCUIT

(56) References Cited

U.S. PATENT DOCUMENTS

| | | | | |
|---|---|---|---|---|
| 2018/0269881 A1* | 9/2018 | Chang | ............ | H03L 1/02 |
| 2018/0302031 A1* | 10/2018 | Saur-Brosch | ............ | H03B 5/32 |
| 2019/0007012 A1* | 1/2019 | Marques | ............ | H03F 3/16 |
| 2020/0091906 A1 | 3/2020 | Kawai | | |
| 2020/0286864 A1* | 9/2020 | Horiguchi | ............ | H02M 7/003 |

FOREIGN PATENT DOCUMENTS

| | | |
|---|---|---|
| JP | 4777861 B2 | 9/2011 |
| JP | 2011-259036 A | 12/2011 |
| JP | 4988883 B2 | 8/2012 |
| JP | 2013-153288 A | 8/2013 |
| JP | 5545045 B2 | 7/2014 |
| JP | 5648690 B2 | 1/2015 |
| JP | 5877074 B2 | 3/2016 |
| JP | 2019-097121 A | 6/2019 |
| JP | 2020-41987 A | 3/2020 |
| WO | WO 2012/035882 A1 | 3/2012 |

OTHER PUBLICATIONS

Blank et al., "Digital Slew Rate and S-Shape Control for Smart Power Switches to Reduce EMI Generation", IEEE Transactions on Power Electronics, vol. 30, No. 9, Sep. 2015, 11 pages.

Denk, et al., "An IGBT Driver Concept with Integrated Real-Time Junction Temperature Measurement", PCIM Europe, 2014, 8 pages.

Brandelero, et al., "On-line Virtual Junction Temperature Measurement via DC Gate Current Injection", CIPS 2018-10$^{th}$ International Conference on Integrated Power Electronics Systems, 2018, 7 pages.

Yamagishi, et al., "A Low-kickback and Low-noise Comparator", Department of Physical Electronics, Tokyo Institute of Technology, 2010, 3 pages (with English Machine Translation).

Goll, et al., "A Clocked, Regenerative Comparator in 0.12 μm CMOS with Tunable Sensitivity", IEEE, 2007, 4 pages.

* cited by examiner

ELECTRONIC CIRCUIT

CROSS-REFERENCE TO RELATED APPLICATIONS

This application is based upon and claims the benefit of priority from Japanese Patent Application No. 2019-163985, filed on Sep. 9, 2019; the entire contents of which are incorporated herein by reference.

FIELD

Embodiments described herein relate generally to an electronic circuit.

BACKGROUND

For example, the input resistance is measured in switching devices used for power circuits. The input resistance of switching devices increases according to the rise of temperature. Thus, it is possible to estimate the junction temperature based on the input resistance. The junction temperature is used for estimating the lifetime of switching devices. For various applications other than power circuits, getting the accurate value of input resistance is also important.

However, generally, the measurement of input resistance for switching devices involves difficulties such as complicated processes and various restrictions.

DETAILED DESCRIPTION

According to one embodiment, an electronic circuit includes an oscillator and a measuring circuit. The oscillator generates a first signal with a frequency corresponding to a time. The measuring circuit measures a first voltage based on a resonance frequency in a terminal of a semiconductor device where the first signal is supplied.

Hereinafter, embodiments of the present invention will be described with reference to the drawings.

Methods for measuring a gate voltage by inputting a sinusoidal current to a gate terminal of a switching device (for example, a semiconductor device such as a field effect transistor) to calculate the gate resistance has been proposed. For example, the gate resistance can be obtained based on the of measured values of voltages generated across a resistor connected to the gate terminal. According to this method, the sinusoidal current having a resonance frequency determined by a parasitic inductance and a parasitic capacitance at the gate terminal of the switching device is used, and effects from parasitic components can be canceled. Therefore, the parasitic inductance and the parasitic capacitance at the gate terminal of the switching device need to be measured in advance.

Also, a method for measuring a gate voltage when a current including a rectangular wave is input to the gate terminal of the switching device and obtaining the gate resistance has been also proposed. The gate voltage is a linear function of the current and the gate resistance. Therefore, when the gate voltage is measured at least twice, the gate resistance and the current value can be calculated. However, ringing may occur in a cases when the parasitic inductance of the gate terminal is large, and there is a possibility that the gate voltage cannot be measured accurately. Also, the gate voltage may exceed the threshold due to the ringing, and there is also a possibility that the switching device turns ON (turns to conductive state) at an undesired timing.

As described above, the measurement of the input resistance of the switching device involves difficulties such as complex processing and various restrictions. In the following, an electric circuit that can measure the input resistance of the switching device highly accurately even for switching devices having parasitic components will be described.

Figure 1:
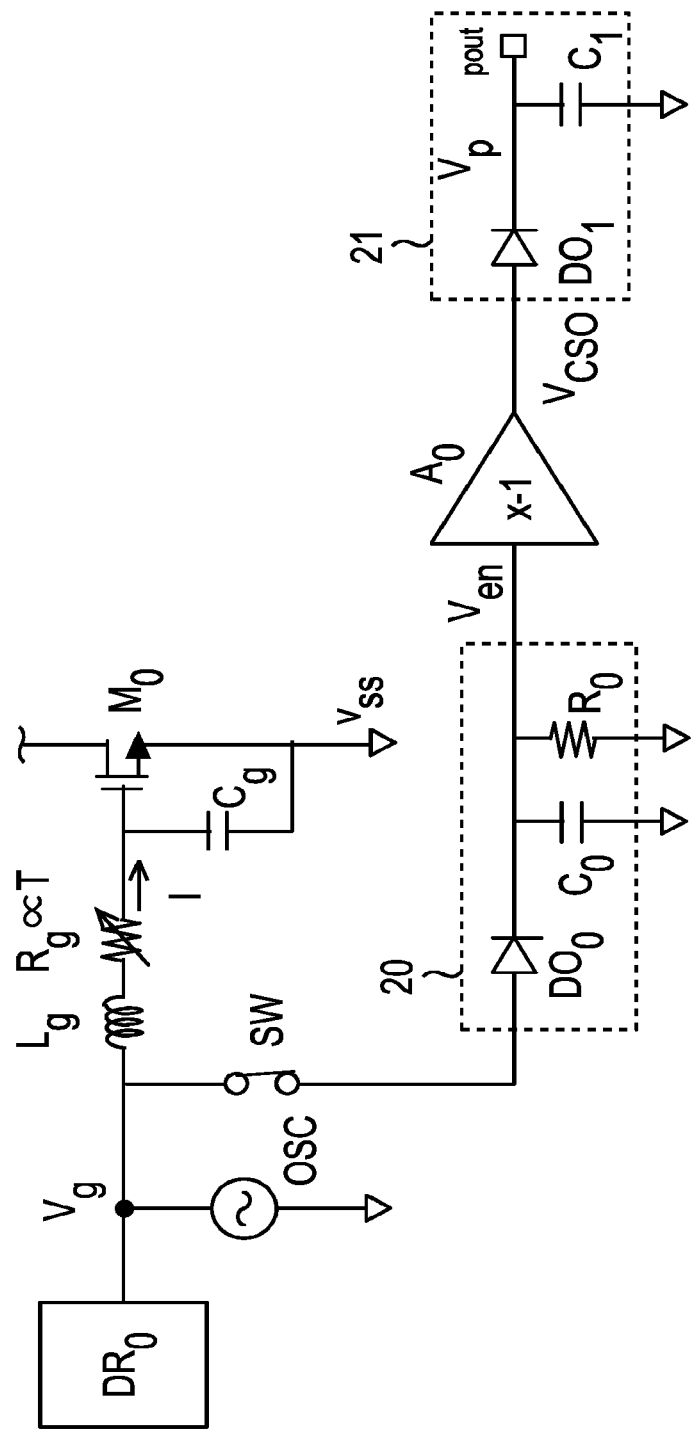
FIG. 1 is a circuit diagram representing an example of an electronic circuit according to an embodiment.

FIG. 1 is a circuit diagram illustrating an example of an electronic circuit according to an embodiment. An electronic circuit 100 in FIG. 1 includes a drive circuit $DR_0$, an oscillator OSC, a switching device $M_0$, an envelope detection circuit 20, an inverting circuit $A_0$, and a peak detection circuit 21. The switching device $M_0$ is an example of the semiconductor device. Hereinafter, explanations will be provided while assuming a case when an input resistance of the semiconductor device is the gate resistance of the switching device $M_0$.

It can be noted that as it is the case for the electronic circuit 100, a switch SW may be connected between a gate terminal of the switching device $M_0$ and the envelope detection circuit 20. The switch SW turns ON (conductive state), for example, at a timing when a peak voltage of the gate terminal is detected. For example, the peak voltage of the gate terminal can be detected at a timing when a gate voltage of the switching device $M_0$ is lower than a threshold voltage. The switch SW may be turned OFF (non-conductive state) at a timing when the gate voltage of the switching device $M_0$ is equal to or higher than the threshold voltage. Thus, the envelope detection circuit 20, an inverting circuit $A_0$, and the peak detection circuit 21 can be protected from the high voltage signal applied to the gate terminal of the switching device $M_0$. The circuit in FIG. 1 illustrates only an example. Therefore, a circuit without the switch SW of the electronic circuit 100 can be used.

The switching device $M_0$ is, for example, an n-channel field effect transistor (FET). However, a switching device of another type such as a p-channel FET or insulated gate bipolar transistor (IGBT) can be used instead of the n-channel FET. As illustrated in the electronic circuit 100, the gate terminal of the switching device $M_0$ has a parasitic inductance $L_g$, a resistance component (gate resistance) $R_g$, and a parasitic capacitance $C_g$. The parasitic capacitance $C_g$ is a capacitance component between the gate terminal and a source terminal of the switching device $M_0$, for example. The resonance frequency $f_{res}$ at the gate terminal of the switching device $M_0$ is determined by the parasitic inductance $L_g$ and the parasitic capacitance $C_g$.

Figure 2:
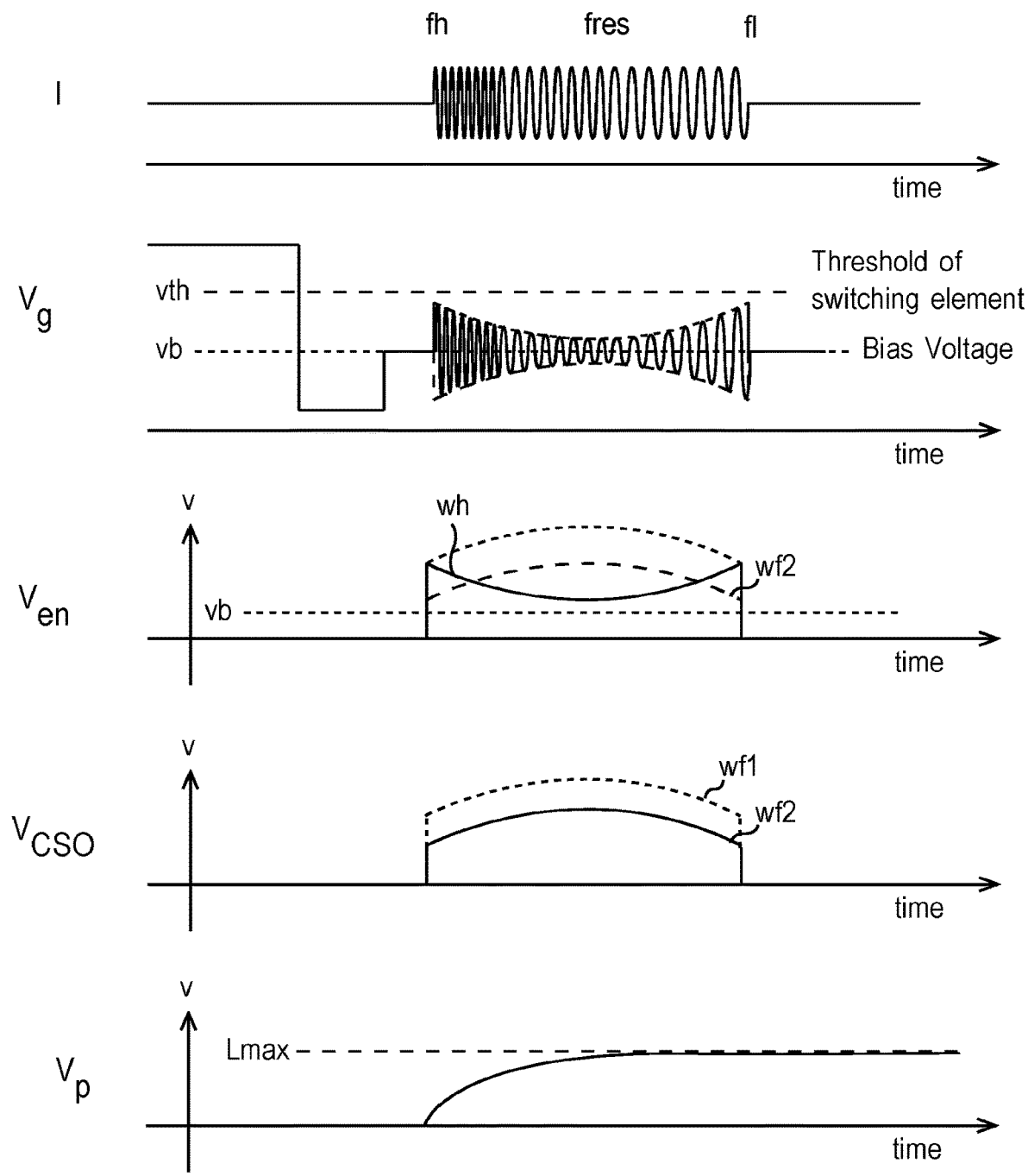
FIG. 2 is a diagram representing an example of a voltage waveform in the electronic circuit.

FIG. 2 is a diagram illustrating an example of a voltage waveform in the electronic circuit. FIG. 2 illustrates the waveform of a current signal I supplied to the gate terminal of the switching device $M_0$ by the oscillator OSC, a waveform of a gate voltage $V_g$ of the switching device $M_0$, a waveform of an output voltage $V_{en}$ of the envelope detection circuit 20, a waveform of an output voltage $V_{CSO}$ of the inverting circuit $A_0$, and a waveform of an output voltage $V_p$ of the peak detection circuit 21. The horizontal axis of FIG. 2 corresponds to the time. Hereinafter, the electronic circuit 100 will be described with reference to FIG. 1 and FIG. 2.

The drive circuit $DR_0$ is connected to the gate terminal of the switching device $M_0$. The drive circuit $DR_0$ generates a voltage signal and controls the voltage of the gate terminal of the switching device $M_0$. Thus, the switching device $M_0$ performs a switching operation.

The oscillator OSC is connected between the gate terminal of the switching device $M_0$ and a ground. For example, a reference potential of a power circuit, a reference potential of an electronic circuit, or a ground potential can be used as the ground. However, any potential can be used as the ground. The oscillator OSC is configured to generate a chirp signal. In the example of FIG. 2, along with the elapse of time, the chirp signal decreases from a frequency fh to a frequency fl. Also, the oscillator OSC can be configured to generate a chirp signal having the frequency increase from fl to fh, along with the elapse of time. Herein, fh>fl is satisfied. The frequency fh and the frequency fl can be determined so that the resonance frequency $f_{res}$ within a frequency band between frequency fl and frequency fh. When the frequency of the input signal at the gate terminal of the switching device $M_0$ is equal to the resonance frequency $f_{res}$, the impedance at the gate terminal takes a minimum value and includes only the resistance component $R_g$ of the gate. Therefore, the frequency of the chirp signal generated by the oscillator OSC may include the resonance frequency determined by the parasitic capacitance and the parasitic inductance of the semiconductor device. The chirp signal is an example of a first signal.

When the oscillator OSC generates the chirp signal, a current $I=V_g Z$ is supplied to the gate terminal of the switching device $M_0$. Here, $V_g$ stands for the gate voltage, and Z stands for the impedance of the gate terminal. When a frequency of the supplied current is equal to the resonance frequency $f_{res}$, the impedance Z at the gate has only the resistance component $R_g$. Therefore, a gate resistance $R_g$ of the switching device $M_0$ can be calculated by dividing the gate voltage $V_g$ when the frequency of the current is equal to the resonance frequency $f_{res}$ by the current value.

FIG. 2 illustrates a waveform of the gate voltage $V_g$ when the chirp signal is generated. By referring to the voltage waveform $V_g$, it can be found that the chirp signal is input at a timing when the gate voltage of the switching device $M_0$ is lower than a threshold voltage vth, and the switching device $M_0$ is OFF (non-conductive state between the gate and the source). Also, even when the chirp signal is input, since the gate voltage of the switching device $M_0$ is lower than the threshold voltage vth, the switching device $M_0$ does not turn ON (conductive state between the gate and the source). The voltage of the chirp signal oscillates while a bias voltage vb at the gate terminal of the switching device $M_0$ is set as a center. The voltage waveform $V_g$ has the minimum amplitude when the chirp signal is an intermediate frequency of the frequency fh and the frequency fl. Therefore, the resonance frequency $f_{res}$ exists in the frequency band between the frequency fh and the frequency fl.

The semiconductor device can be a power device. The oscillator can generate the chirp signal while the power device is in the non-conductive state. In other words, the oscillator generates the first signal during the power device turned off.

The envelope detection circuit 20 is connected between the gate terminal of the switching device $M_0$ and the inverting circuit $A_0$. The envelope detection circuit 20 includes a diode $DO_0$, a capacitor $C_0$, and a resistor $R_0$. The diode $DO_0$ is connected between the gate terminal of the switching device $M_0$ and the inverting circuit $A_0$. The capacitor $C_0$ is connected between a cathode of diode $DO_0$ and the ground. Therefore, a first detection circuit (envelope detection circuit) can include a first diode (diode $DO_0$), a first capacitor, and a first resistor. An anode terminal of the first diode is connected to the semiconductor device. Also, the first capacitor and the first resistor can be connected between a cathode terminal of the first diode and the ground.

The envelope detection circuit 20 performs envelope detection of the gate voltage $V_g$ of the switching device $M_0$. FIG. 2 illustrates a waveform (solid line wh) of an envelope detection signal $V_{en}$ generated by the envelope detection circuit 20. The envelope detection signal illustrated by the solid line wh has a convex waveform to the negative voltage direction. The envelope detection signal is supplied to the inverting circuit $A_0$ in a subsequent stage. The envelope detection signal is an example of a second signal.

The inverting circuit $A_0$ is connected between the envelope detection circuit 20 and the peak detection circuit 21. The inverting circuit $A_0$ can be an inverting amplification circuit including an operation amplifier, for example. However, as long as the inverting circuit $A_0$ can invert the signal, and any type of circuit can be used. Also, amplification of the signal in the inverting circuit $A_0$ is not essential. The inverted signal of the envelope detection signal generated by the inverting circuit $A_0$ is supplied to the peak detection circuit 21 in the subsequent stage. The inverted signal is an example of a third signal.

FIG. 2 illustrates the waveform of the output voltage $V_{CSO}$ of the inverting circuit $A_0$. The waveform (solid line wf2) of the inverted signal ($V_{CSO}$) generated by the inverting circuit $A_0$ has an axisymmetric shape respect to the waveform (solid line wh) of the envelope detection signal ($V_{en}$) generated by the envelope detection circuit 20 and the bias voltage vb. Also, the waveform (solid line wf2) of the inverted signal ($V_{CSO}$) generated by the inverting circuit $A_0$ has a waveform that is convex to the positive voltage direction. As illustrated in the broken line wf1, boosting of the signal may be performed in the inverting circuit $A_0$. Also, the amplification of the signal can be performed in the inverting circuit $A_0$. If boosting and/or amplification of the signal is performed, the waveform of the inverted signal ($V_{CSO}$) does not have to be strictly axisymmetric shaped respect to the waveform of (solid line wh) of the envelope detection signal ($V_{en}$) and the bias voltage vb. The peak detection circuit 21 is connected to a downstream side of the inverting circuit $A_0$. In the peak detection circuit 21, a diode $DO_1$ and a capacitor $C_1$ are connected in series between the inverting circuit $A_0$ and the ground. A terminal pout is located between the diode $DO_1$ and the capacitor $C_1$. The peak voltage of the inverted signal ($V_{CSO}$) is output from the terminal pout. Thus, the second detection circuit (peak detection circuit) can include a second diode (for example, the diode $DO_1$) and a second capacitor (for example, the capacitor $C_1$). Here, an anode terminal of the second diode is connected to the inverting circuit. The second capacitor is connected between a cathode terminal of the second diode and the ground.

FIG. 2 illustrates the waveform of voltage $V_p$ at the terminal pout in the peak detection circuit 21. The voltage $V_p$ at the terminal pout increases gradually along with the elapse of time, approaching the voltage Lmax. Here, the voltage level Lmax corresponds to the peak voltage of the inverted signal ($V_{CSO}$) supplied from the inverting circuit $A_0$. By dividing the peak voltage Lmax of the inverted signal ($V_{CSO}$) by a value based on the current value at the gate terminal of the switching device $M_0$, the gate resistance $R_g$ of the switching device $M_0$ can be calculated. When the peak voltage Lmax of the inverted signal ($V_{CSO}$) is used, effects from the parasitic components (the parasitic inductance $L_g$ and the parasitic capacitance $C_g$) at the gate terminal of the switching device $M_0$ can be canceled. It is noted that a peak voltage is not limited to a maximum voltage level of the inverted signal ($V_{CSO}$) when the chirp signal is input. For example, the peak voltage can include a quasi-maximum voltage level (quasi-peak voltage). For example, a voltage that is decreased by approximately 0 to 10% respect to the peak voltage may be used as the quasi-peak voltage.

When the electronic circuit 100 is used, regardless of the presence of the parasitic components, the input resistance of the switching device (semiconductor device) can be measured highly accurately, and the junction temperature can be estimated. Thus, life prediction of the switching device can also be performed, and maintenance of the circuit including the switching device (for example, the power circuit) becomes easier.

When the electronic circuit 100 is used, the value of the parasitic capacitance $C_g$ and the value of the parasitic inductance $L_g$ are calculated roughly, and a frequency band [fl, fh] of the chirp signal generated by the oscillator OSC can be determined. However, the value of the parasitic capacitance $C_g$ and the value of the parasitic inductance $L_g$ do not need to be measured. For example, the frequency band [fl, fh] can be determined by using an experimental value or an estimated value of approximately a power of 10 which is derived from catalog values. Although the value of the parasitic inductance may fluctuate within the frequency band [fl, fh] of the chirp signal for some cases, the measurement of the gate resistance $R_g$ is not affected. Also, it is sufficient when an adequate order of each value of the parasitic components is present, and therefore it is not necessarily to take the difference in characteristics due to gate wiring lengths and implementations of the switching devices into account.

Therefore, the electronic circuit can include an oscillator, a semiconductor device (for example, the switching device $M_0$), a first detection circuit (envelope detection circuit), an inverting circuit, and a second detection circuit (peak detection circuit). The oscillator is configured to generate a chirp signal. The chirp signal is supplied to the semiconductor device. The first detection circuit is configured to generate the envelope detection signal based on the input voltage of the semiconductor device. The inverting circuit is configured to generate an inverted signal of the envelope detection signal. The second detection circuit is configured to measure a peak voltage of the inverted signal. A frequency of the chirp signal in the peak voltage of the inverted signal may be a resonance frequency.

The electronic circuit can include an oscillator and a measuring circuit. The oscillator can generate a first signal with a frequency corresponding to a time. The measuring circuit can measure a first voltage based on a resonance frequency in a terminal of a semiconductor device where the first signal is supplied. Also, the electronic circuit can further include the semiconductor device.

Here, the measuring circuit can include a first generator circuit, a second generator circuit and a voltage measuring circuit. The first generator circuit can generate a second signal based on an envelope of a second voltage in the terminal of the semiconductor device where the first signal is supplied. The second generator circuit can generate a third signal by inverting the second signal. The voltage measuring circuit can measure the first voltage by measuring a peak voltage of the third signal.

The first detection circuit is an example of a first generator circuit. Also, the inverting circuit is an example of a second generator circuit. The second detection circuit is an example of a voltage measuring circuit.

The frequency of the first signal corresponding to the peak voltage of the third signal can be equal to the resonance frequency. The resonance frequency can be based on parasitic capacitance and parasitic inductance of the semiconductor device. The frequency of the first signal can include the resonance frequency.

The first generator circuit can include a first diode, a first capacitor and a first resistor. The anode terminal of the first diode can be connected to the semiconductor device. The first capacitor and the first resistor are connected between a cathode terminal of the first diode and a ground. The aforementioned envelope detection circuit is an example of the first generator circuit.

The voltage measuring circuit can include a second diode and a second capacitor. The anode terminal of the second diode can be connected to the second generator circuit. The second capacitor can be connected between a cathode terminal of the second diode and a ground. The aforementioned peak detection circuit is an example of the voltage measuring circuit.

(First Variation of Electronic Circuit)

The electronic circuit 100 in FIG. 1 is merely an example of a circuit that can measure the input resistance of the switching device. Therefore, measurement of the input resistance of the switching device can be performed by using a circuit having a configuration different from the above electronic circuit. Hereinafter, an electronic circuit that avoids potentials in parts of the circuit to be fixed to the power supply voltage will be described.

Figure 3:
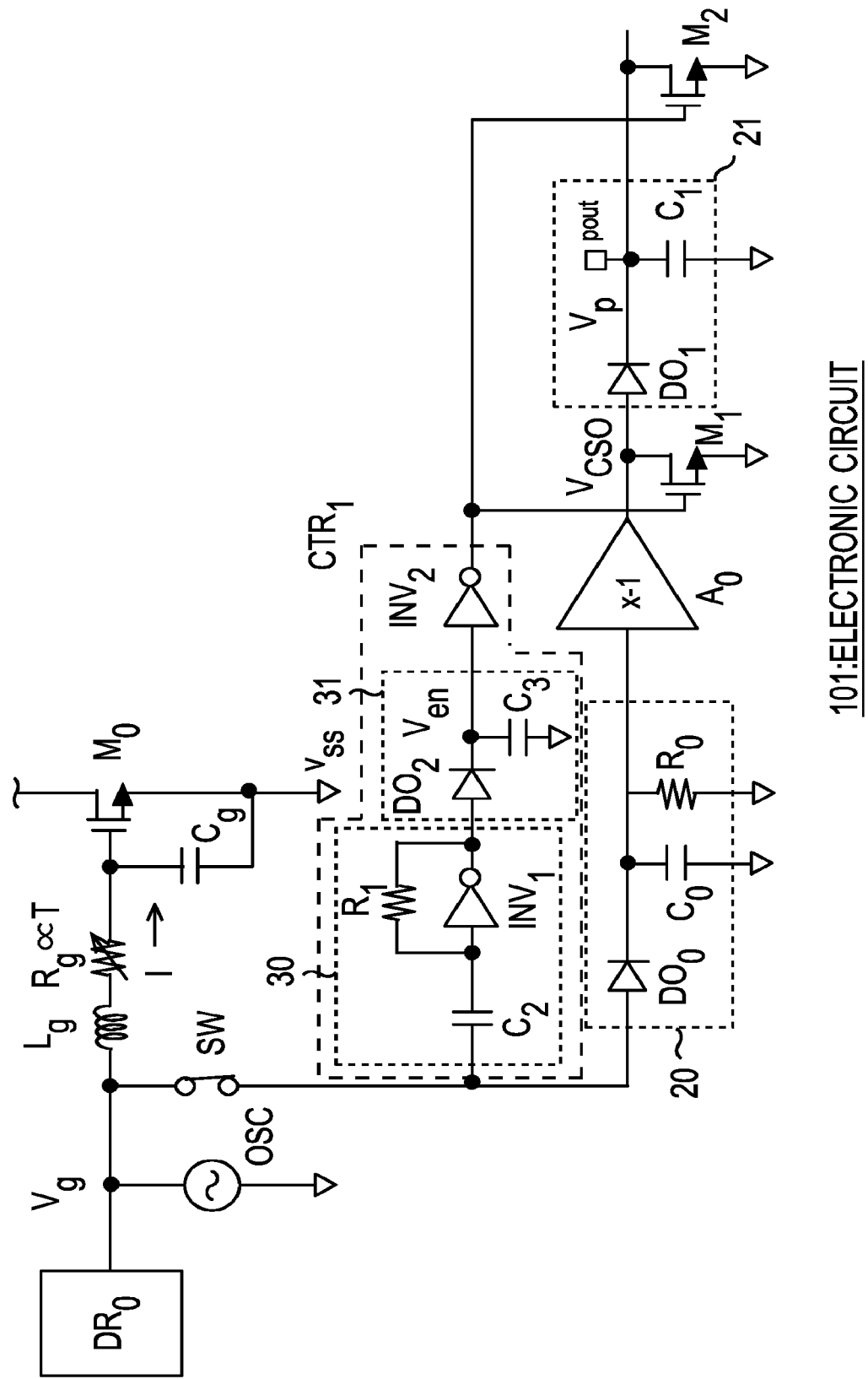
FIG. 3 is a circuit diagram representing an electronic circuit according to a first variation.

FIG. 3 is a circuit diagram illustrating a first variation of the electronic circuit. An electronic circuit 101 in FIG. 3 includes a control circuit $CTR_1$ in addition to the components of the electronic circuit 100. The control circuit $CTR_1$ includes an amplification circuit 30, a peak detection circuit 31, an inverter $INV_2$, a transistor $M_1$, and a transistor $M_2$. The transistor $M_1$ and the transistor $M_2$ are both n-channel FETs. The amplification circuit 30 is connected to the gate terminal of the switching device $M_0$. Also, the peak detection circuit 31 is connected to the downstream side of the amplification circuit 30. Then, the inverter $INV_2$ is connected to the downstream side of the peak detection circuit 31. For example, a CMOS inverter can be used as the inverter $INV_2$. However an inverter with any type of configuration can be used.

The drain terminal of the transistor $M_1$ is connected to a node between the inverting circuit $A_0$ and the peak detection circuit 21. Source terminals of the transistors $M_1$ and $M_2$ are connected to the ground. Gate terminals of the transistors $M_1$ and $M_2$ are connected to the inverter $INV_2$. Also, the drain terminal of the transistor $M_2$ is connected to the terminal pout in the peak detection circuit 21.

The amplification circuit 30 includes, for example, a capacitor $C_2$, an inverter $INV_1$, and a resistor $R_1$. The resistor $R_1$ is connected to the inverter $INV_1$ in series. For example, a CMOS inverter can be used as the inverter $INV_1$. However any type of inverter can be used. The chirp signal is supplied to the amplification circuit 30 from the oscillator OSC. Then, the amplification circuit 30 amplifies the chirp signal. The amplification circuit 30 in FIG. 3 is merely an example of the configuration of the amplification circuit. Therefore, an amplification circuit or an amplifier having a configuration different from the illustrated circuit can be used.

The peak detection circuit 31 includes, for example, a diode $DO_2$ and a capacitor $C_3$. The anode of the diode $DO_2$ is connected to the amplification circuit 30. Also, the capacitor $C_3$ is connected between the cathode of the diode $DO_2$ and the ground. The peak detection circuit 31 detects the maximum value of the voltage signal supplied from the amplification circuit 30. Then, the inverter $INV_2$ inverts the voltage level of the signal.

When the gate voltage of the switching device $M_0$ is lower than the threshold voltage and the oscillator OSC does not generate the chirp signal, the voltage at a node between the amplification circuit 30 and the peak detection circuit 31 becomes LOW. At this timing, the output voltage of the inverter $INV_2$ becomes HIGH. When the output voltage of the inverter $INV_2$ is HIGH, the gate voltages of the transistors $M_1$ and $M_2$ exceed the threshold voltage. The path between the gate terminal and the source terminal of the transistors $M_1$ and $M_2$ are turned ON (set to conductive state). The potential ($V_{CSO}$) at the node between the inverting circuit $A_0$ and the peak detection circuit 21, and the potential in the terminal pout both are set to values to that of the ground. Thus, the potential in the node of the electronic circuit 101 will no longer be fixed to the power supply potential.

When the oscillator OSC starts generation of the chirp signal, the voltage at the node between the amplification circuit 30 and the peak detection circuit 31 changes to HIGH. At this timing, the output voltage of the inverter $INV_2$ changes to LOW. When the output voltage of the inverter $INV_2$ is LOW, the gate voltages of the transistors $M_1$ and $M_2$ are lower than the threshold voltage. The path between the gate terminal and the source terminal of the transistors $M_1$ and $M_2$ are turned ON (set to conductive state). Then, the electronic circuit 101 can perform the operation for detecting the above peak voltage Lmax. The transistors $M_1$ and $M_2$ can operate as a switches which reset the voltage levels in the electronic circuit 101.

Thus, the electronic circuit can further include a first switch (for example, the transistor $M_1$) and a second switch (for example, the transistor $M_2$). The first node connects the inverting circuit and the second detection circuit (for example, the peak detection circuit 21). The first switch connects the first node and the ground. The second switch connects the output terminal of the second detection circuit and the ground. Also, the electronic circuit can further include a control circuit. If the oscillator does not generate the chirp signal, the control circuit sets the first switch and the second switch to the conductive state. If the oscillator generates the chirp signal, the control circuit sets the first switch and the second switch to the non-conductive state.

The other components of the electronic circuit 101 are similar to those of the aforementioned electronic circuit 100.

(Second Variation of Electronic Circuit)

Figure 4:
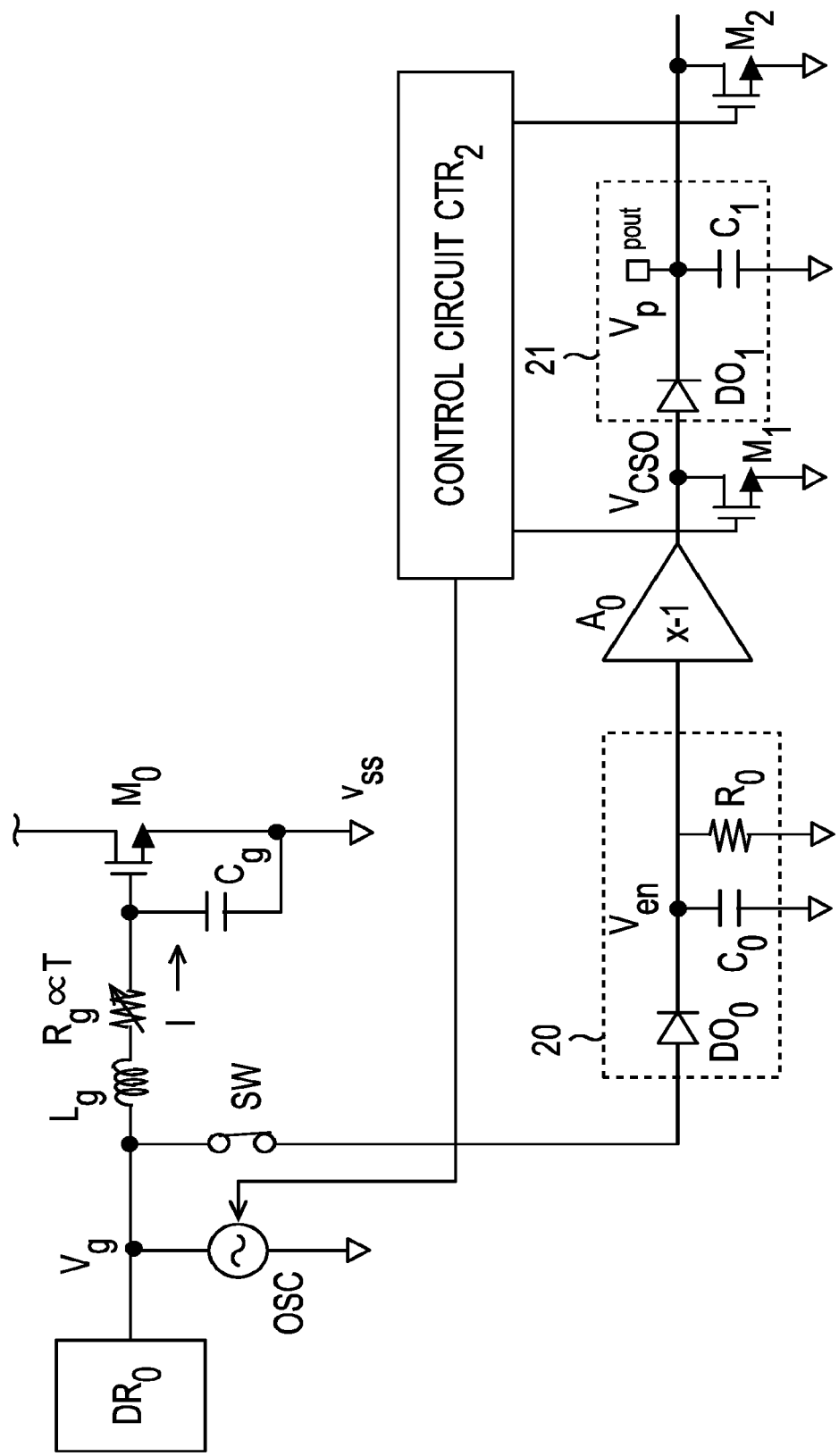
FIG. 4 is a circuit diagram representing an electronic circuit according to a second variation.

FIG. 4 is a circuit diagram illustrating a second variation of the electronic circuit. An electronic circuit 102 in FIG. 4 includes a control circuit $CTR_2$, in addition to the components of the electronic circuit 100. The control circuit $CTR_2$ is connected to the oscillator OSC and the gate terminals of the transistors $M_1$ and $M_2$.

The control circuit $CTR_2$ controls the oscillator OSC. Also, the control circuit $CTR_2$ controls voltage levels of the gate terminal of the transistor $M_1$ and the gate terminal of the transistor $M_2$. When the oscillator OSC does not generate the chirp signal, the control circuit $CTR_2$ sets the voltages of the gate terminal of the transistor $M_1$ and the gate terminal of the transistor $M_2$ to HIGH. On the other hand, when the oscillator OSC generates the chirp signal, the control circuit $CTR_2$ sets the voltages of the gate terminal of the transistor $M_1$ and the gate terminal of the transistor $M_2$ to LOW.

Similar to the electronic circuit 101, the voltage $V_{CSO}$ at the node between the inverting circuit $A_0$ and the peak detection circuit 21 and the voltage of the terminal pout are no longer fixed to the power supply potential. The other components of the electronic circuit 102 are similar to those of the above electronic circuit 100.

Thus, the electronic circuit can further include a first node, a first switch, an output terminal of the voltage measuring circuit and a second switch. The first node connects the second generator circuit and the voltage measuring circuit. The first switch connects the first node and a ground. The second switch connects the output terminal and the ground. The electronic circuit can further include a control circuit. The control circuit is configured to turn on both the first switch and the second switch if the oscillator does not generate the first signal and turn off both the first switch and the second switch if the oscillator generates the first signal.

(Third Variation of Electronic Circuit)

Figure 5:
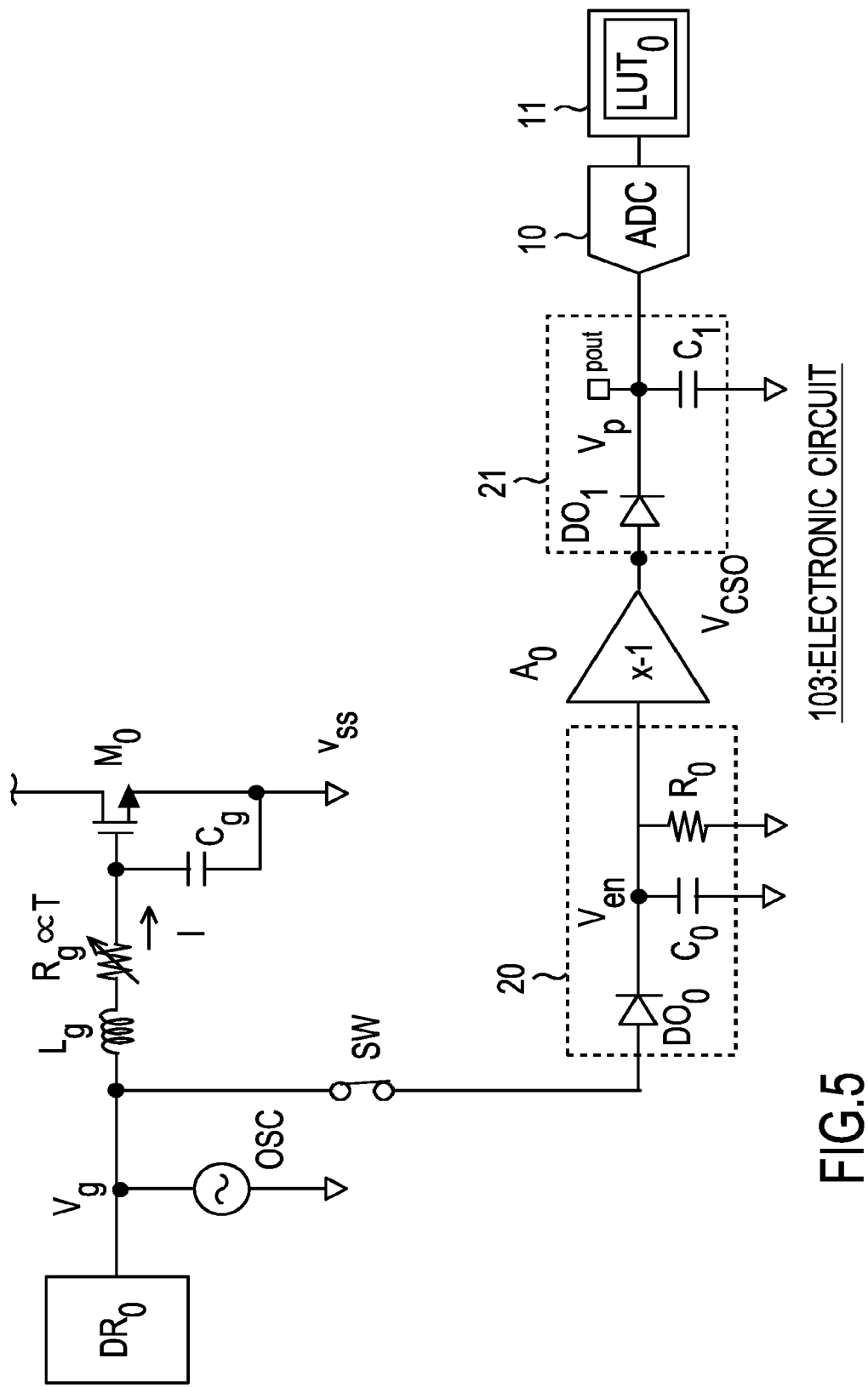
FIG. 5 is a circuit diagram representing an electronic circuit according to a third variation.

FIG. 5 is a circuit diagram illustrating a third variation of the electronic circuit. The electronic circuit 103 in FIG. 5 includes an analog-to-digital converter 10 and a processor 11 in addition to the components of the electronic circuit 100. The analog-to-digital converter 10 is connected to the terminal pout of the peak detection circuit 21. Then, the processor 11 is connected to a downstream side of the analog-to-digital converter 10. The processor 11 includes a look-up table $LUT_0$. The processor 11 can be implemented with a hardware circuit or can also be implemented with a combination of a processor and a program. The look-up table can be implemented, for example, by a multiplexer or can also be implemented by a memory (storage) such as an SRAM. However, the look-up table can be implemented in any way.

The analog-to-digital converter 10 digitalizes the peak voltage Lmax determined by the peak detection circuit 21. The peak voltage digitalized by the analog-to-digital converter 10 is input to the processor 11. The processor 11 refers to the look-up table and estimates at least either the gate resistance of the switching device $M_0$ or the junction temperature of the switching device $M_0$, based on the digitalized peak voltage. The processor 11 can save the value of the gate resistance and/or an estimated value of the junction temperature in a memory (for example, a NOR flash memory or a NAND flash memory). Here, the memory can be a memory implemented in the processor 11. Also, the processor 11 can save the estimated value in an external storage. Also, the processor 11 can display the estimated value on an external display (not illustrated).

Thus, the electronic circuit can further include an analog-to-digital converter that digitalizes the peak voltage, and a processor that estimates at least either the input resistance of the semiconductor device or the temperature of the semiconductor device based on the digitalized peak voltage.

The other components of the electronic circuit 103 are similar to those of the electronic circuit 100. When the electronic circuit 103 is used, it becomes possible to predict the life of the switching device. Therefore, maintenance of the circuit including the switching device (for example, the power circuit) becomes easier. Here, a case where the peak voltage and/or the junction temperature is estimated using the look-up table has been described as an example. However, the processor does not necessarily need to execute estimates based on the look-up table. For example, the processor can estimate the peak voltage and/or the junction temperature based on a predetermined calculation expression (algorithm).

The electronic circuit can further include an analog-to-digital converter and a processor. The analog-to-digital converter can be configured to digitalize the first voltage. The processor can be configured to estimate at least either resistance of the terminal of the semiconductor device or a temperature of the semiconductor device based on the digitalized first voltage.

(Fourth Variation of Electronic Circuit)

Figure 6:
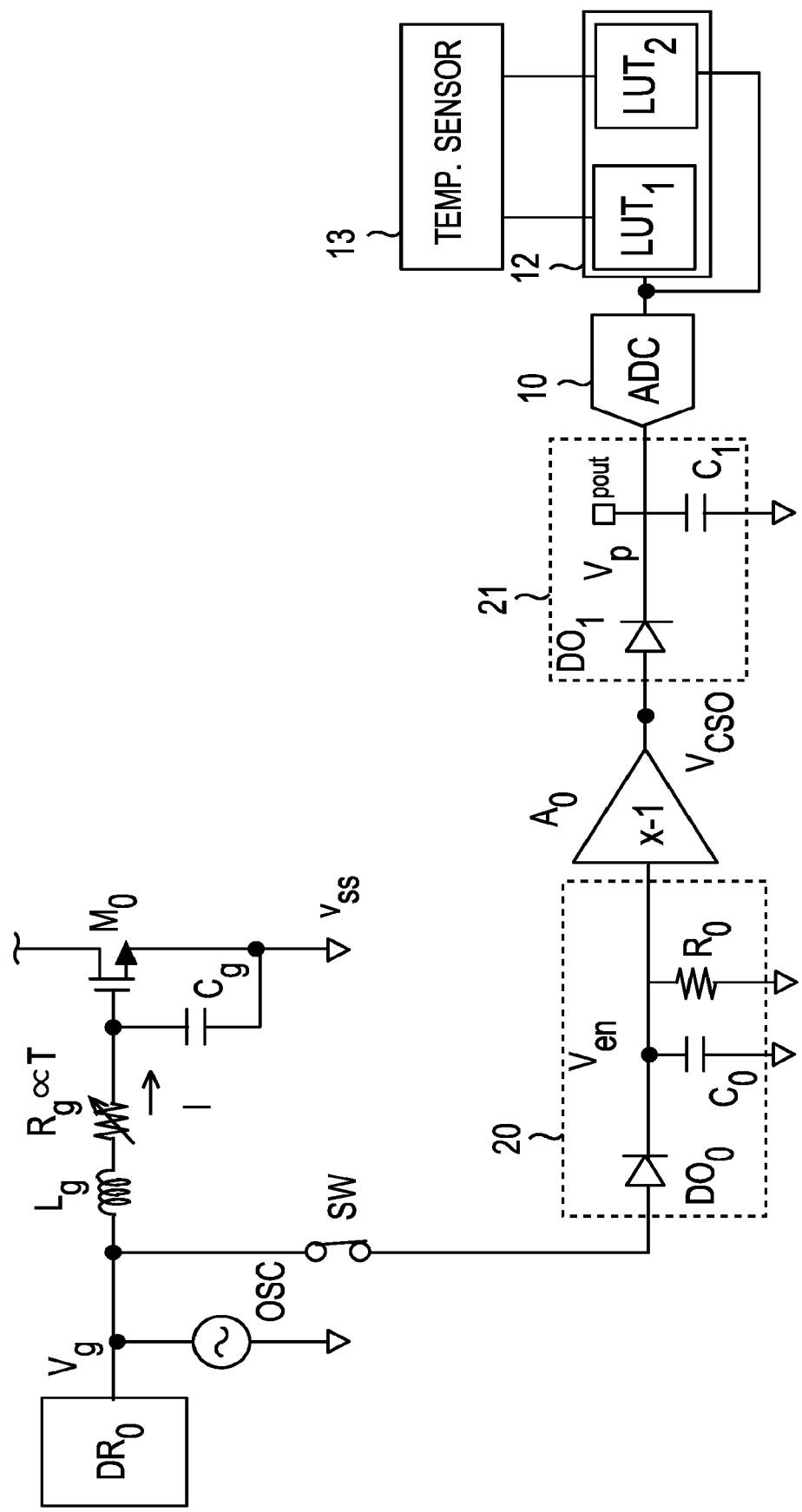
FIG. 6 is a circuit diagram representing an electronic circuit according to a fourth variation.

FIG. 6 is a circuit diagram illustrating a fourth variation of the electronic circuit. The electronic circuit 104 in FIG. 6 includes the analog-to-digital converter 10, a processor 12, and a temperature sensor 13 in addition to the components of the electronic circuit 100. The analog-to-digital converter 10 is connected to the terminal pout of the peak detection circuit 21. Then, the processor 12 is connected to the downstream side of the analog-to-digital converter 10. The processor 12 can be implemented by using a hardware circuit or can be implemented by using a combination of a processor and a program. The processor 12 includes two look-up tables (a look-up table $LUT_1$ and a look-up table $LUT_2$). The look-up table can be implemented, for example, by a multiplexer or can be implemented by a memory such as an SRAM. However, the look-up table can be implemented in any way. The processor can include three or more look-up tables.

The processor 12 can obtain the measured temperature from the temperature sensor 13. The temperature sensor 13 can be either an on-chip temperature sensor or a discrete temperature sensor. For example, a thermistor, a thermometer resistor, or a thermocouple can be used as the temperature sensor 13. However, any type of temperature sensor can be used. The temperature sensor 13 can be implemented, for example, in a chip where the electronic circuit 104 is implemented, or a package where elements of the electronic circuit 104 are implemented. Also, the temperature sensor 13 can be implemented adjacently to the chip where the elements of the electronic circuit 104 are implemented. As long as temperature change in any one of devices of the electronic circuit 104 can be measured, no particular limitation is imposed to the implementation and configuration of the temperature sensor 13.

The analog-to-digital converter 10 digitalizes the peak voltage Lmax obtained from the peak detection circuit 21. The processor 12 obtains the peak voltage digitalized by the analog-to-digital converter 10. The processor 12 selects the look-up table to be referred based on the measured value of the temperature sensor 13. Then, the processor 12 refers to either of the look-up tables and estimates at least either the gate resistance of the switching device $M_0$ or the junction temperature of the switching device $M_0$ based on the digitalized peak voltage. For example, the processor 12 can be configured to refer to the look-up table $LUT_1$ in an environment with a relatively low temperature, and refer to the look-up table $LUT_2$ in an environment with a relatively high temperature.

The processor 12 can save the value of the gate resistance of the switching device $M_0$ and/or the estimated value of the junction temperature of the switching device $M_0$ to a memory (for example, a NOR flash memory or a NAND flash memory). Here, the memory can be a memory implemented in the processor 12. Also, the processor 12 can save the estimated value in an external storage. Also, the processor 12 can display the estimated value on an external display (not illustrated). It can be noted that an electronic circuit (processor) including a control device and an arithmetic device of hardware can be used as the processor 12. Examples of the processor include a general-purpose processor, a central processing unit (CPU), a microprocessor, a digital signal processor (DSP), and combinations of these.

Thus, the electronic circuit can further include the temperature sensor. Here, the processor includes a plurality of look-up tables used for the estimation of either the input resistance of the semiconductor device or the temperature of the semiconductor device, and can select at least one look-up table from the plurality of look-up tables based on the measured value of the temperature sensor.

The other components of the electronic circuit 104 are similar to those of the above electronic circuit 100. When the electronic circuit 104 is used, it is possible to predict the life of the switching device. Therefore, maintenance of the circuit including the switching device (for example, the power circuit) becomes easier. Particularly, since the plurality of look-up tables each designed for different temperature ranges are implemented in the electronic circuit 104, the value of the gate resistance and the junction temperature can be estimated accurately.

The electronic circuit can further include a temperature sensor. The processor can be configured to select at least one of a plurality of lookup tables based on temperature measured by the temperature sensor. The plurality of lookup tables can be used for estimating at least either the resistance of the terminal of the semiconductor device or the temperature of the semiconductor device by the processor. The processor can estimate at least either the resistance of the terminal of the semiconductor device or the temperature of the semiconductor device further based on at least the one of the plurality of lookup tables.

(Fifth Variation of Electronic Circuit)

Figure 7:
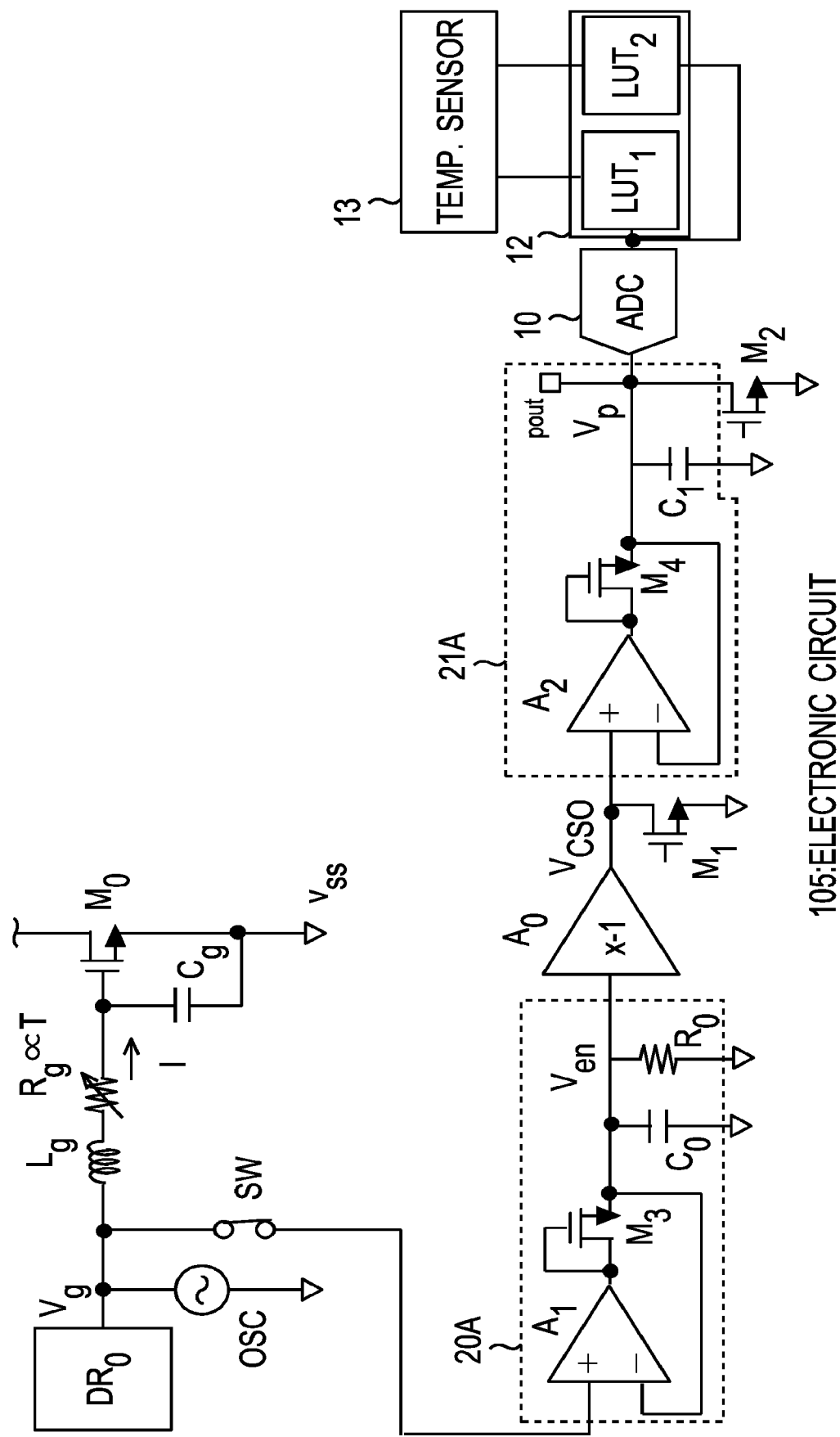
FIG. 7 is a circuit diagram representing an electronic circuit according to a fifth variation.

FIG. 7 is a circuit diagram illustrating a fifth variation of the electronic circuit. In an electronic circuit 105 of FIG. 7, the configuration of the envelope detection circuit 20A is different from that of the envelope detection circuit 20 in the electronic circuit 104. Similarly, in the electronic circuit 105, the configuration of a peak detection circuit 21A is different from the peak detection circuit 21 in the electronic circuit 105. Also, the transistor $M_1$ and the transistor $M_2$ are added to the electronic circuit 105, respectively.

The envelope detection circuit 20A includes an operation amplifier $A_1$, a transistor $M_3$, the capacitor $C_0$, and the resistor $R_0$. The transistor $M_3$ is an n-channel FET. A positive terminal (non-inverting terminal) of the operation amplifier $A_1$ is connected to the gate terminal of the switching device $M_0$. The operation amplifier is an example of the amplifier. A drain terminal of the transistor $M_3$ is connected to a terminal in the downstream side of the operation amplifier $A_1$. The amplified signal is supplied from the terminal in the downstream side of the operation amplifier $A_1$. Also, a gate terminal and the drain terminal of the transistor $M_3$ are shorted. Thus, the transistor $M_3$ is a diode-connected transistor. Also, the source terminal of the transistor $M_3$ is connected to a node in an upstream side of the inverting circuit $A_0$ and a negative terminal (inverting terminal) of the operation amplifier $A_1$. The capacitor $C_0$ and the resistor $R_0$ are connected in parallel between the source terminal of the transistor $M_3$ (node in the upstream side of the inverting circuit $A_0$) and the ground.

Thus, the first detection circuit (envelope detection circuit) in the electronic circuit can include a first amplifier (for example, the operation amplifier $A_1$), an n-channel first transistor (for example, the transistor $M_3$), the first capacitor (for example, capacitor $C_0$), and the first resistor (for example, the resistor $R_0$). Here, the positive terminal of the first amplifier is connected to the semiconductor device. The source terminal of the first transistor is connected to the negative terminal of the first amplifier. The gate terminal and the drain terminal of the first transistor are shorted and connected to the terminal in the downstream side of the first amplifier. The first capacitor and the first resistor are connected between the source terminal of the first transistor and the ground.

On the other hand, the transistor $M_1$ is connected between a node in the downstream side of the inverting circuit $A_0$ and the ground. As described in the electronic circuit 101 and the electronic circuit 102, the transistor $M_1$ operates as the switch which avoids the voltage of the node in the circuit to be fixed to the power supply potential. The transistor $M_1$ can be controlled by any one of the methods of the electronic circuit 101 and the electronic circuit 102.

The peak detection circuit 21A includes an operation amplifier $A_2$, a transistor $M_4$, and the capacitor $C_1$. The transistor $M_4$ is an n-channel FET. The positive terminal (non-inverting terminal) of the operation amplifier $A_2$ is connected to the node in the downstream side of the inverting circuit $A_0$. The drain terminal of the transistor $M_4$ is connected to the downstream side of the operation amplifier $A_2$. The gate terminal and the drain terminal of the transistor $M_4$ are shorted. Therefore, the transistor $M_4$ is also a diode-connected transistor. Also, the source terminal of the transistor $M_4$ is connected to the terminal pout, a node on an upstream side of the analog-to-digital converter 10, and the negative terminal (inverting terminal) of the operation amplifier $A_2$, respectively. The capacitor $C_1$ is connected between the source terminal of the transistor $M_4$ (node in the upstream side of the analog-to-digital converter 10) and the ground.

Thus, the second detection circuit (peak detection circuit) in the electronic circuit can include a second amplifier (for example, the operation amplifier $A_2$), an n-channel second transistor (for example, the transistor $M_4$), and the second capacitor (for example, the capacitor $C_1$). Here, the positive terminal of the second amplifier is connected to the inverting circuit. The source terminal of the second transistor is connected to the negative terminal of the second amplifier. The gate terminal and a drain terminal of the second transistor are shorted and connected to the downstream side of the second amplifier. The second capacitor is connected between the source terminal of the second transistor and the ground.

On the other hand, the transistor $M_2$ is connected between the terminal pout and the ground. As described in the electronic circuit 101 and the electronic circuit 102, the transistor $M_2$ functions as a switch that prevents the nodes in the circuit to be fixed to the power supply potential. The transistor $M_2$ can be controlled by either of the elements in the electronic circuit 101 and the electronic circuit 102.

The other configurations of other parts in the electronic circuit 105 are similar to that of the above electronic circuit 104. If electronic circuit 105 is used, the value of the gate resistance and the junction temperature can be estimated accurately.

The first generator circuit can include a first amplifier, a first transistor having a n-channel, a first capacitor and a first resistor. The positive terminal of the first amplifier can be connected to the semiconductor device. The source terminal of the first transistor can be connected to a negative terminal of the first amplifier. The gate terminal and a drain terminal of the first transistor can be shorted and can be connected to a downstream side of the first amplifier. The first capacitor and the first resistor can be connected between the source terminal of the first transistor and a ground.

The voltage measuring circuit can include a second amplifier, a second transistor having a n-channel and a second capacitor. The positive terminal of the second amplifier can be connected to the second generator circuit. The source terminal of the second transistor can be connected to the negative terminal of the second amplifier. The gate terminal and the drain terminal of the second transistor can be shorted and can be connected to the downstream side of the second amplifier. The second capacitor can be connected between the source terminal of the second transistor and the ground.

(Location Examples of Temperature Sensor)

Figure 8:
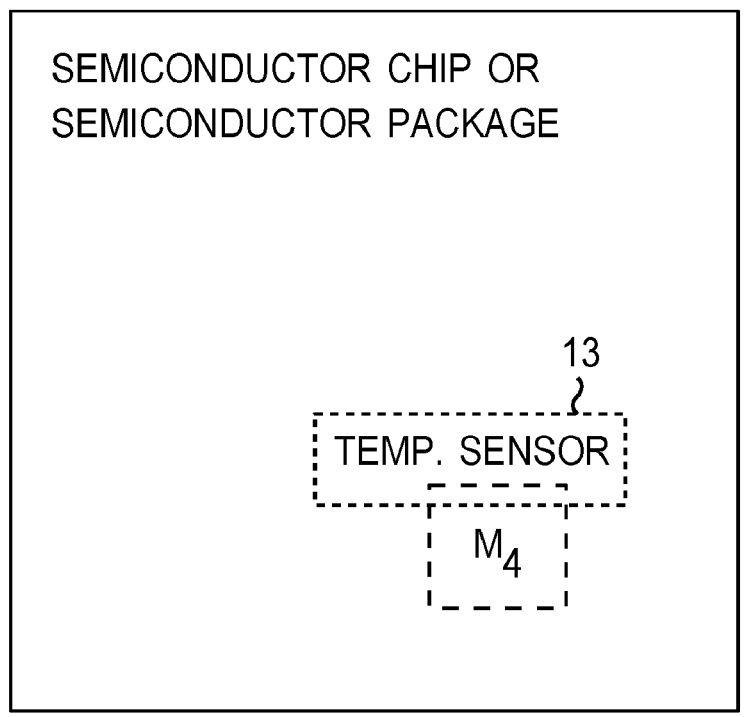
FIG. 8 is a plan view diagram representing an example of a location of a temperature sensor.
Figure 9:
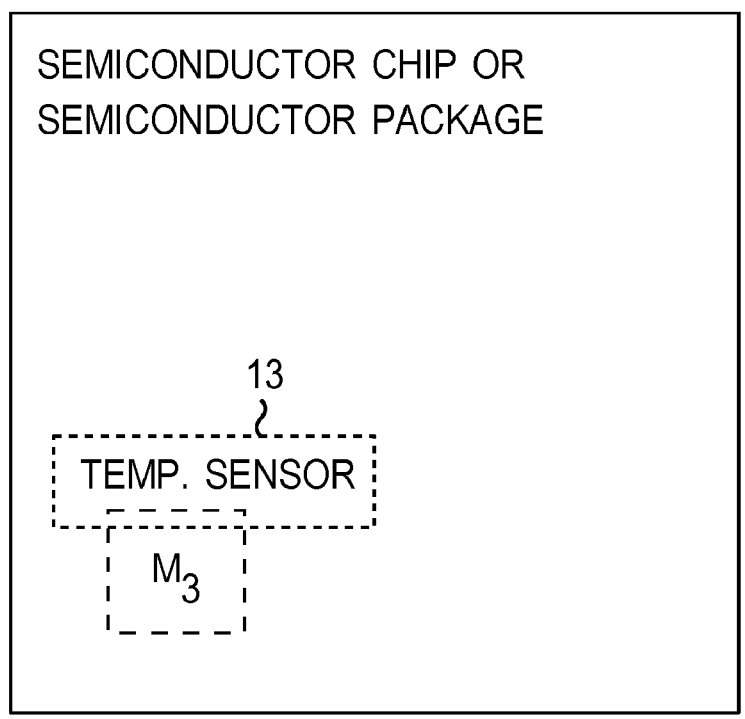
FIG. 9 is a plan view diagram representing an example of the location of the temperature sensor.

FIG. 8 and FIG. 9 are plan view diagrams illustrating an example of an arrangement of the temperature sensor 13 in the semiconductor chip or the semiconductor package. As illustrated in FIG. 8, the temperature sensor 13 can be located adjacently to the transistor $M_4$. Also, as illustrated in FIG. 9, the temperature sensor 13 can be located adjacently to the transistor $M_3$. By locating the temperature sensor 13 adjacently, it is possible to set the thermal resistance between the block including the temperature sensor 13 and the a block including the transistor $M_3$ or $M_4$ is smaller than the thermal resistance between the temperature sensor 13 and the outside air by an order of magnitude, for example. Also, a case where the temperature sensor 13 and the transistor $M_3$ or $M_4$ are located in the same chip substrate can be also described as a case when the temperature sensor 13 is located adjacently to the transistor $M_3$ or $M_4$.

In other words, in the electronic circuit, the temperature sensor can be located adjacently to the first transistor (transistor $M_3$) in the semiconductor chip or the semiconductor package. Also, in the electronic circuit, the temperature sensor can be located adjacently to the second transistor (transistor $M_4$) in the semiconductor chip or the semiconductor package.

The transistor has temperature characteristics respect to the threshold voltage at the gate terminal, a voltage between the gate and the source, a voltage between the source and the drain, or the like. As illustrated in FIG. 8 and FIG. 9, the look-up table for the appropriate temperature range can be selected by locating the temperature sensor 13 adjacently to the transistor. Thereby, the value of the gate resistance and the junction temperature can be estimated accurately.

The electronic circuit can further include an analog-to-digital converter, a temperature sensor and a processor. The analog-to-digital converter can be configured to digitalize the first voltage. The temperature sensor can be located adjacently to the first transistor within a semiconductor chip or a semiconductor package. The processor can be configured to estimate at least either resistance of the terminal of the semiconductor device or a temperature of the semiconductor device based on temperature measured by the temperature sensor, the digitalized first voltage, and at least one of a plurality of lookup tables. The plurality of lookup tables can be used for estimating at least either the resistance of the terminal of the semiconductor device or the temperature of the semiconductor device by the processor.

The electronic circuit can further include an analog-to-digital converter, a temperature sensor and a processor. The analog-to-digital converter can be configured to digitalize the first voltage. The temperature sensor can be located adjacently to the second transistor within a semiconductor chip or a semiconductor package. The processor can be configured to estimate at least either resistance of the terminal of the semiconductor device or a temperature of the semiconductor device based on temperature measured by the temperature sensor, the digitalized first voltage, and at least one of a plurality of lookup tables. The plurality of lookup tables can be used for estimating at least either the resistance of the terminal of the semiconductor device or the temperature of the semiconductor device by the processor.

(Sixth Variation of Electronic Circuit)

Figure 10:
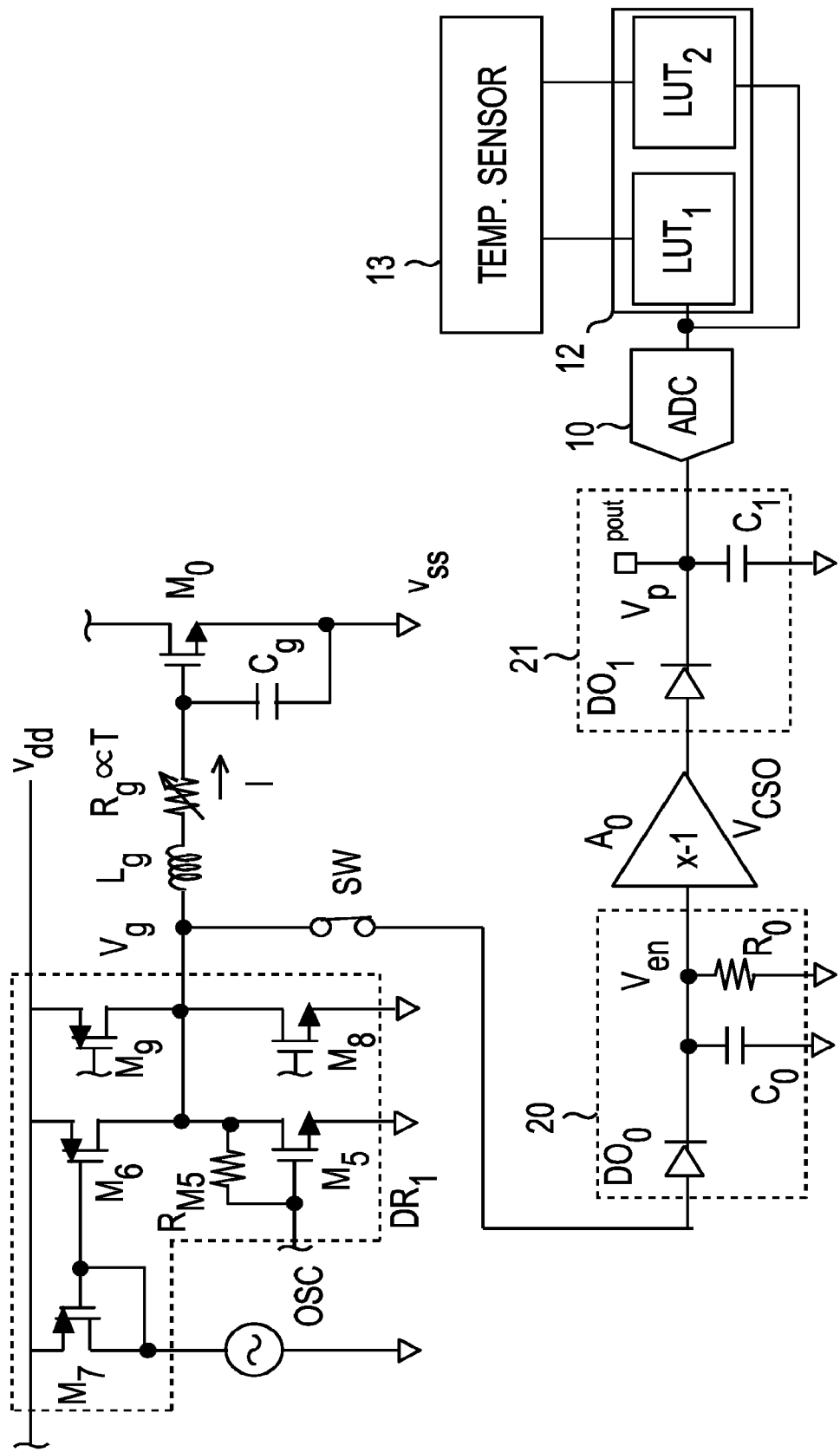
FIG. 10 is a circuit diagram representing an electronic circuit according to a sixth variation.

FIG. 10 is a circuit diagram illustrating a sixth variation of the electronic circuit. Referring to the electronic circuit 106 in FIG. 10, the configuration of circuit in the input side of the switching device $M_0$ is different from the above electronic circuit 100. In the electronic circuit 106, the oscillator OSC and a drive circuit $DR_1$ are connected on the input side of the switching device $M_0$. The drive circuit $DR_1$ includes three p-channel FETs (a transistor $M_6$, a transistor $M_7$, and a transistor $M_9$), and two n-channel FETs (a transistor $M_5$ and a transistor $M_8$), and a resistor $R_{M5}$.

The oscillator OSC is connected between the drain terminal of the transistor $M_7$ and the ground. Therefore, the chirp signal generated by the oscillator OSC is supplied to the drive circuit $DR_1$. Each of the source terminals of the transistors $M_7$, $M_6$, and $M_9$ is connected to a power supply potential $v_{dd}$. Also, each of source terminals of the transistor $M_5$ and $M_8$ is connected to the ground. The drain terminal and a gate terminal are shorted in the transistor $M_7$. Therefore, the transistor $M_7$ is a diode-connected transistor. The gate terminal of the transistor $M_6$ is connected to the gate terminal of the transistor $M_7$. The drain terminal of the transistor $M_6$ is connected to a drain terminal of the transistor $M_5$. Also, the gate terminal of the transistor $M_5$ and the drain terminal of the transistor $M_5$ are connected to each other via the resistor $R_{M5}$. Thus, the transistor $M_5$ is also a diode-connected transistor.

The drain terminal of the transistor $M_9$ is connected to the drain terminal of the transistor $M_8$. The node which connects the gate terminal of the transistor $M_6$ and the gate terminal of the transistor $M_7$ is connected to the node which connects the drain terminal of the transistor $M_9$ and the drain terminal of the transistor $M_8$. Also, the node which connects the drain terminal of the transistor $M_9$ and the drain terminal of the transistor $M_8$ is connected to the gate terminal of the switching device $M_0$ and the envelope detection circuit 20.

The transistor $M_5$ and the transistor $M_6$ determine the bias voltage vb in the gate terminal of the switching device $M_0$. The transistor $M_8$ and the transistor $M_9$ control the ON/OFF state of the switching device $M_0$. Also, the chirp signal amplified via the drive circuit $DR_1$ is supplied to the gate terminal of the switching device $M_0$.

The configuration of the drive circuit illustrated in the electronic circuit 106 is merely an example. Therefore, a drive circuit having a configuration different from the aforementioned configuration may be used. Also, the connection between the drive circuit and the oscillator OSC can be different. The functions of the other components of the electronic circuit 106 are similar to those of the above respective electronic circuits.

(Seventh Variation of Electronic Circuit)

Figure 11:
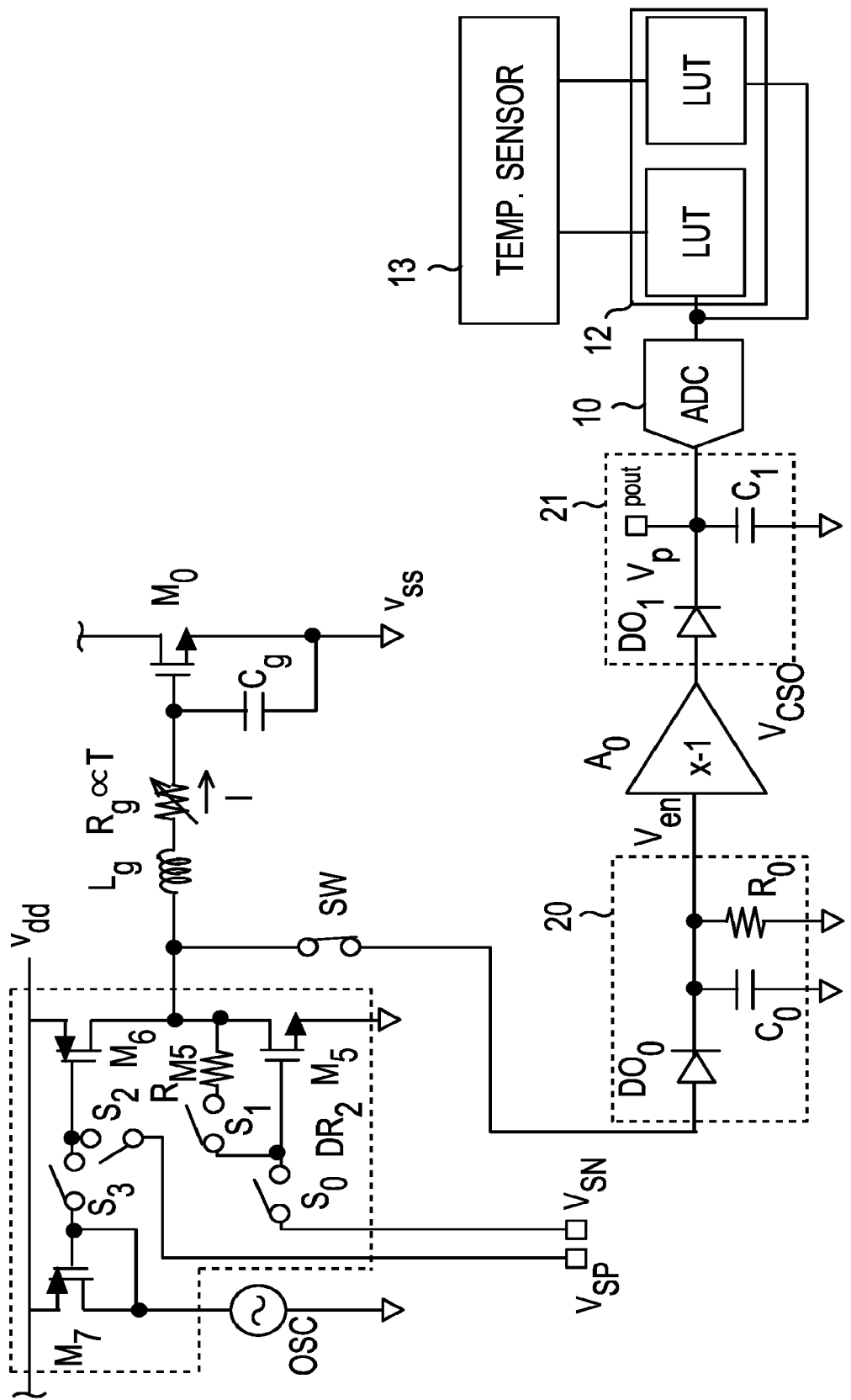
FIG. 11 is a circuit diagram representing an electronic circuit according to a seventh variation.

FIG. 11 is a circuit diagram illustrating a seventh variation of the electronic circuit. An electronic circuit 107 in FIG. 11 has a configuration where the transistor $M_8$ and the transistor $M_9$ are omitted from the above electronic circuit 106, while switches $S_0$ to $S_3$ are added.

In the electronic circuit 107, the oscillator OSC and the drive circuit $DR_2$ are connected to the input side of the switching device $M_0$. The drive circuit $DR_2$ includes two p-channel FETs (the transistor $M_6$ and the transistor $M_7$), one n-channel FET (transistor $M_5$), four switches (switch $S_0$, the switch $S_1$, the switch $S_2$, and the switch $S_3$), and the resistor $R_{M5}$. The terminal $V_{SP}$ and the terminal $V_{SN}$ are connected to the drive circuit $DR_2$. The control signal of the switching device $M_0$ can be supplied via the terminals $V_{SP}$ and $V_{SN}$. When the control signal is supplied to the terminals $V_{SP}$ and $V_{SN}$, the switching device $M_0$ turns ON (conductive state).

The oscillator OSC is connected between the drain terminal of the transistor $M_7$ and the ground. Therefore, the chirp signal generated by the oscillator OSC is supplied to the drive circuit $DR_2$. The source terminals in the transistors $M_6$ and $M_7$ are connected to the power supply potential $v_{dd}$. Also, the source terminal of the transistor $M_5$ is connected to the ground. The drain terminal and the gate terminal are shorted in the transistor $M_7$. Therefore, the transistor $M_7$ is a diode-connected transistor. The switch $S_3$ is located in a node between the gate terminal of the transistor $M_7$ and the gate terminal of the transistor $M_6$. Also, the node between the gate terminal of the transistor $M_7$ and the gate terminal of the transistor $M_6$ is connected to the terminal $V_{SP}$ via the switch $S_2$.

The drain terminal of the transistor $M_6$ is connected to the drain terminal of the transistor $M_5$. The node between the drain terminal of the transistor $M_6$ and the drain terminal of the transistor $M_5$ is connected to the gate terminal of the switching device $M_0$ and the envelope detection circuit 20. The gate terminal of the transistor $M_5$ is connected to the terminal $V_{SP}$ via the switch $S_0$. Also, the gate terminal and the drain terminal of the transistor $M_5$ are connected to each other via the switch $S_1$ and the resistor $R_{M5}$. The switch $S_1$ and the resistor $R_{M5}$ are connected in series.

The conductive states of aforementioned switches $S_0$ to $S_3$ can be controlled according to the operation of the electronic circuit 107. For example, if the input resistance at the gate terminal of the switching device $M_0$ and/or the junction temperature is estimated, the switch $S_1$ and the switch $S_3$ can be turned ON (conductive state), and the switch $S_0$ and the switch $S_2$ can be turned OFF (non-conductive state). Control of the switches $S_0$ to $S_3$ can be performed by a control circuit which is not illustrated in FIG. 11. This control circuit can be the control circuit $CTR_1$ illustrated in FIG. 4 or a different control circuit. At this timing, the transistor $M_5$ becomes diode-connected, and the gate voltage of the switching device $M_0$ becomes lower than the threshold voltage. Thus, when the switching device $M_0$ is turned OFF, the chirp signal can be input to the gate terminal.

On the other hand, if the switching device $M_0$ is turned ON, the switch $S_1$ and the switch $S_3$ can be turned OFF (non-conductive state), and the switch $S_0$ and the switch $S_2$ can be turned ON (conductive state). In this timing, the control signal of the terminal $V_{SP}$ is supplied to the gate terminal of the transistor $M_6$. Also, the control signal of the terminal $V_{SN}$ is supplied to the gate terminal of the transistor $M_5$. Thus, the transistor $M_5$ and the transistor $M_6$ can determine the bias voltage in the gate terminal of the switching device $M_0$ and drive the switching device $M_0$. In this timing, the chirp signal is not supplied to the gate terminal of the switching device $M_0$.

For example, the electronic circuit can further include a third transistor (transistor $M_6$) which is a p-channel transistor, an fourth transistor (transistor $M_5$) which is a n-channel transistor, and a second resistor. Here, the source terminal of the third transistor is connected to the power supply potential. A second node connecting the drain terminal of the third transistor and the drain terminal of the fourth transistor is connected to the semiconductor device. The source terminal of the fourth transistor is connected to the ground. The gate terminal and the drain terminal of the fourth transistor are connected to each other via the second resistor.

Also, the electronic circuit can further include a fifth transistor (transistor $M_7$) which is a p-channel transistor, a third switch (switch $S_0$), a fourth switch (switch $S_1$), a fifth switch (switch $S_2$), and a sixth switch (switch $S_3$). Here, the source terminal of the fifth transistor is connected to the power supply potential. The gate terminal and the drain terminal of the fifth transistor are shorted and connected to the oscillator. The gate terminal of the fifth transistor and the gate terminal of the third transistor are connected to each other via the sixth switch. The gate terminal of the third transistor is connected to the first terminal via the fifth switch. The gate terminal of the fourth transistor is connected to a second terminal via the third switch. The fourth switch is connected between the gate terminal and the drain terminal of the fourth transistor in series with the second resistor.

The conductive states of the above third to sixth switches can be controlled according to the operation of the electronic circuit. For example, while the oscillator generates the chirp signal, the fourth switch and the sixth switch can be turned ON (conductive state), and the third switch and the fifth switch can be turned OFF (non-conductive state). Also, in the electronic circuit, while a control signal specifying the conductivity of the semiconductor device is supplied to the first terminal (terminal $V_{SP}$) and the second terminal (terminal $V_{SN}$), the third switch and the fifth switch can be turned ON (conductive state), and the fourth switch and the sixth switch can be in the non-conductive state (OFF). The control of the third to sixth switches can be performed by a control circuit which is not illustrated in the figure. This control circuit can be the control circuit $CTR_1$ illustrated in FIG. 4 or a different control circuit.

The configuration of the drive circuit illustrated in the electronic circuit 107 is merely an example. Therefore, a drive circuit having a different configuration from the examples described above be used. Also, the connection between the drive circuit and the oscillator OSC can be different from the example presented above. It can be noted that the functions of the other components of the electronic circuit 107 are similar to those of the electronic circuits described above.

The electronic circuit can further include a third transistor having a p-channel, a fourth transistor having a n-channel and a second resistor. The source terminal of the third transistor can be connected to a power supply potential. The second node connecting a drain terminal of the third transistor and the drain terminal of the fourth transistor can be connected to the semiconductor device. The source terminal of the fourth transistor can be connected to a ground. The source terminal and the drain terminal of the fourth transistor can be connected via the second resistor.

The electronic circuit can further include a fifth transistor having a p-channel, a third switch, a fourth switch, a fifth switch and a sixth switch. The source terminal of the fifth transistor can be connected to the power supply potential. The gate terminal and the drain terminal of the fifth transistor can be shorted and can be connected to the oscillator. The gate terminal of the fifth transistor and the gate terminal of the third transistor can be connected via the sixth switch. The gate terminal of the third transistor can be connected to a first terminal via the fifth switch. The gate terminal of the fourth transistor can be connected to a second terminal via the third switch. The fourth switch and the second resistor can be connected in series between the gate terminal and the drain terminal of the fourth transistor. Here, the first terminal and second terminal can receive control signals corresponding to a conducting state of the semiconductor device.

During generation of the first signal by the oscillator, both the fourth switch and the sixth switch can be turned on, and both the third switch and the fifth switch can be turned off. During supply of the control signals to the first terminal and the second terminal, both the third switch and the fifth switch can be turned on and both the fourth switch and the sixth switch can be turned off.

Figure 12:
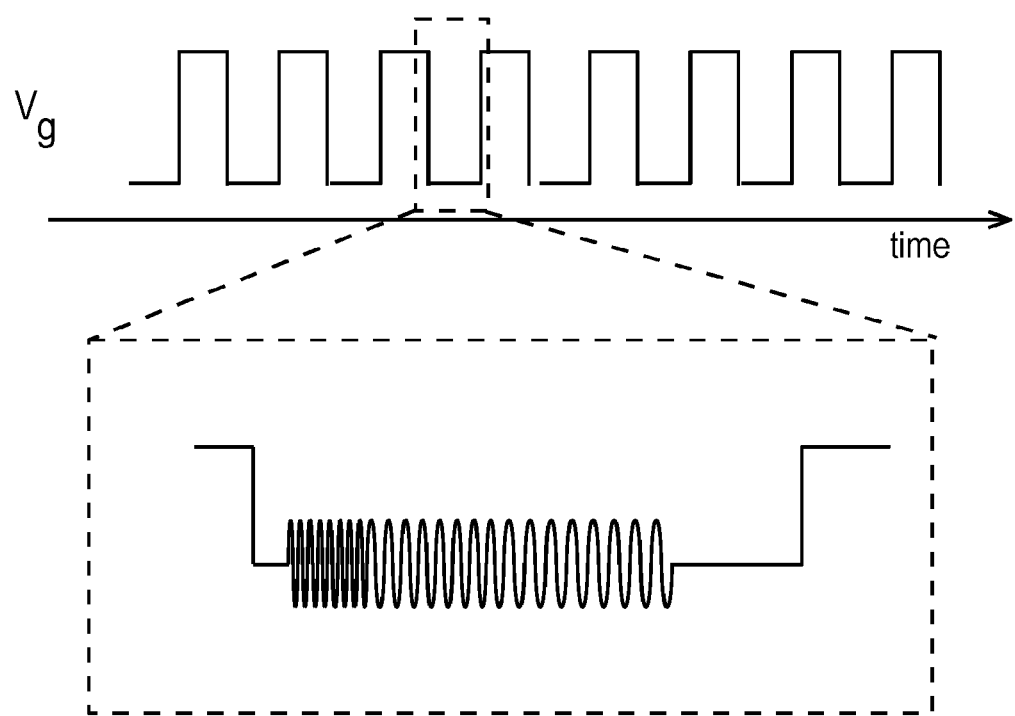
FIG. 12 is a diagram representing an example of the timings when a chirp signal is generated.

FIG. 12 illustrates an example of the timings when the chirp signal is generated. In a circuit with improved power factors, the power supply circuit, the inverter drive circuit, or the like, the voltage signal as illustrated by $V_g$ in FIG. 12 is input to the gate terminal of the switching device $M_0$. The waveform of the voltage signal $V_g$ becomes a periodic pulse. When the pulse is at a HIGH level (rising), the switching device $M_0$ turns ON (conductive state). Then, when the pulse is at a LOW level (falling), the switching device $M_0$ turns OFF (non-conductive state). For example, when the pulse is at the LOW level, by inputting the chirp signal to the gate terminal of the switching device $M_0$, the input resistance at the gate terminal and/or the junction temperature can be estimated while the gate voltage is reduced to a value lower than the threshold voltage.

When the above respective electronic circuits are used, regardless of the presence of parasitic components, the input resistance of the switching device can be measured accurately. Calculation of the junction temperature of the switching device based on the input resistance of the switching device can be executed easily. Thus, the life of the switching device can be predicted more accurately, and maintenance of the circuit including the switching device (for example, the power circuit) becomes easier.

The terms used in the embodiments should be interpreted broadly. For example, the term "processor" may include a general-purpose processor, a central processor (CPU), a microprocessor, a digital signal processor (DSP), a controller, a micro-controller, and a state machine. Depending on situations, the "processor" may indicate an application specific integrated circuit, a field programmable gate array (FPGA), a programmable logic circuit (PLD), and the like. The "processor" may indicate a combination of processing devices such as a plurality of microprocessors, a combination of a DSP and a microprocessor, and one or more microprocessors cooperating with a DSP core.

As another example, the term "memory" may include any electronic component capable of storing electronic information. The "memory" can indicate a random access memory (RAM), a read only memory (ROM), a programmable read only memory (PROM), an erasable programmable read only memory (EPROM), an electrically erasable PROM (EEPROM), a nonvolatile random access memory (NVRAM), a flash memory, and a magnetic or optical data storage. The data saved in the devices mentioned above can be read by a processor. If the processor performs reads, writes or both reads and writes to the memory, the memory can be considered to be communicating electrically with the processor. The memory can be integrated with the processor. In such cases as well, the memory can be considered as communicating electrically with the processor.

The term "storage device" or "storage" may include any device that can store data using magnetic technology, optical technology, or nonvolatile memory. For example, the storage can be a HDD, an optical disk, a SSD, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit comprising:
an oscillator that generates a single chirp signal having different frequencies in accordance with time, the chirp signal being applied to a gate terminal of a semiconductor switching device;
a detection circuit that generates an envelope detection signal based on an input voltage to the gate terminal of the semiconductor switching device, the gate terminal being applied with the chirp signal;
an inverting circuit that generates an inverting signal of the envelope detection signal; and
an output circuit that outputs a peak voltage of the inverting signal.

2. The electronic circuit according to claim 1, wherein a frequency of the chirp signal generated by the oscillator includes a resonance frequency defined by a parasitic capacitance and a parasitic inductance at the gate terminal of the semiconductor switching device.

3. The electronic circuit according to claim 2, wherein the frequency of the chirp signal at a peak voltage of the inverting signal is the resonance frequency.

4. The electronic circuit according to claim 1, further comprising:
a control circuit configured to:
control a voltage of the gate terminal of the semiconductor switching device to control a conducting state and a non-conducting state of the semiconductor switching device, and
control the oscillator to generate the chirp signal when the semiconductor switching device is in the non-conducting state.

5. The electronic circuit according to claim 1, further comprising:
a first node connected to the inverting circuit and the output circuit;
a first switch connected to the first node and a ground;
an output terminal of the output circuit; and
a second switch connected to the output terminal and a ground.

6. The electronic circuit according to claim 5, further comprising:

a control circuit configured to:
control a voltage of the gate terminal of the semiconductor switching device to control a conducting state and a non-conducting state of the semiconductor switching device,
control the oscillator to generate the chirp signal when the semiconductor switching device is in the non-conducting state,
set the first switch and the second switch to be in the conducting state when the oscillator does not generate the chip signal, and
set the first switch and the second switch to be in the non-conducting state when the oscillator generates the chirp signal.

7. The electronic circuit according to claim 1, wherein the detection circuit comprises a first diode, a first capacitor, and a first resistor,
an anode terminal of the first diode is connected to the semiconductor switching device, and
the first capacitor and the first resistor are connected between the anode terminal of the first diode and a ground.

8. The electronic circuit according to claim 1, wherein the output circuit comprises a second diode and a second capacitor,
an anode terminal of the second diode is connected to the inverting circuit, and
the second capacitor is connected between the anode terminal of the second diode and a ground.

9. The electronic circuit according to claim 1, further comprising:
an analog-to-digital that digitizes the peak voltage; and
processing circuitry configured to estimate at least one of an input resistance of the semiconductor switching device or a temperature of the semiconductor switching device based on the digitized peak voltage.

10. The electronic circuit according to claim 9, further comprising a temperature sensor that measures a temperature of the detection circuit or the output circuit, wherein
the processing circuitry comprises a plurality of lookup tables used to estimate at least one of the input resistance or the temperature of the semiconductor switching device, and
the processing circuitry is configured to select one of the plurality of lookup tables based on a measured value of the temperature sensor.

11. The electronic circuit according to claim 10, wherein the detection circuit comprises a first operational amplifier, an n-channel first transistor, a first capacitor, and a first resistor,
a non-inverting terminal of the first operational amplifier is connected to a gate terminal of the semiconductor switching terminal,
a source terminal of the first transistor is connected to an inverting terminal of the first operational amplifier,
a gate terminal and a drain terminal of the first transistor are shorted and connected to an output terminal of the first operational amplifier, and
the first capacitor and the first resistor are connected between the source terminal of the first transistor and a ground.

12. The electronic circuit according to claim 10, wherein the output circuit comprises a second operational amplifier, an n-channel second transistor, and a second capacitor,
a non-inverting terminal of the second operational amplifier is connected to the inverting circuit, a source terminal of the second transistor is connected to an inverting terminal of the second operational amplifier, a gate terminal and a drain terminal of the second transistor are shorted and connected to an output terminal of the second operational amplifier, and the second capacitor is connected between the source terminal of the second transistor and a ground.

13. The electronic circuit according to claim 11, wherein the detection circuit and the temperature sensor are included in a semiconductor chip or a semiconductor package; and the temperature sensor is disposed adjacently to the first transistor.

14. The electronic circuit according to claim 12, wherein the output circuit and the temperature sensor are included in a semiconductor chip or a semiconductor package, and the temperature sensor is disposed adjacent to the second transistor.

15. The electronic circuit according to claim 1, further comprising a p-channel third transistor;
an n-channel fourth transistor; and
a second resistor, wherein
a gate terminal of the third transistor is connected to the oscillator,
a source terminal of the third transistor is connected to a power supply potential,
a second node connected to a drain terminal of the third transistor and a drain terminal of the fourth transistor is connected to the gate terminal of the semiconductor switching device,
a source terminal of the fourth transistor is connected to a ground, and
the gate terminal and the drain terminal of the fourth transistor are connected through the second resistor.

16. The electronic circuit according to claim 15, further comprising a p-channel fifth transistor;
a third switch;
a fourth switch;
a fifth switch; and
a sixth switch, wherein
a source terminal of the fifth transistor is connected to the power supply potential,
a gate terminal and a drain terminal of the fifth transistor are shorted and connected to the oscillator,
the gate terminal of the fifth transistor and the gate terminal of the third transistor are connected through the sixth switch,
the gate terminal of the third transistor is connected to a first terminal through the fifth switch, the first terminal being applied with the control signal of the semiconductor switching device through the fifth switch,
the gate terminal of the fourth transistor is connected to a second terminal of the semiconductor switching device through the third switch, the second terminal being applied with a control signal of the semiconductor switching device, and
the fourth switch is connected in series to the second resistor between the gate terminal and the drain terminal corrected in series to the second resistor.

17. The electronic circuit according to claim 4,
a p-channel third transistor;
an n-channel fourth transistor;
a p-channel fifth transistor;
a third switch;
a fourth switch;
a fifth switch;
a sixth switch; and
a second resistor, wherein
a gate terminal of the third transistor is connected to the oscillator,
a source terminal of the third transistor is connected to a power supply potential,
a second node connected to a drain terminal of the third transistor and a drain terminal of the third transistor is connected to the gate terminal of the semiconductor switching device,
a source terminal of the fourth transistor is connected to a ground,
a gate terminal and a drain terminal of the fourth transistor is connected through the second resistor,
a source terminal of the fifth transistor is connected to a power supply potential,
a gate terminal and a drain terminal of the fifth transistor is shorted and connected to the oscillator,
the gate terminal of the fifth transistor and gate terminal of the third transistor are connected through the sixth switch,
the gate terminal of the third transistor is connected to a first terminal applied with a control signal of the semiconductor switching device through the fifth switch,
a gate terminal of the fourth transistor is connected to a second terminal applied with the control signal of the semiconductor switching device through the third switch,
the fourth switch is connected in series to the second resistor between the gate terminal and the drain terminal of the fourth transistor, and
the control circuit sets the fourth switch and the sixth switch to be in the conducting state and sets the third switch and the fifth switch when the oscillator generates the chirp signal.

18. The electronic circuit according to claim 4,
a p-channel third transistor;
an n-channel fourth transistor;
a p-channel fifth transistor;
a third switch;
a fourth switch;
a fifth switch;
a sixth switch; and
a second resistor, wherein
a gate terminal of the third transistor is connected to the oscillator,
a source terminal of the third transistor is connected to a power supply potential,
a second node connected to a drain terminal of the third transistor and a drain terminal of the third transistor is connected to the gate terminal of the semiconductor switching device,
a source terminal of the fourth transistor is connected to a ground,
a gate terminal and a drain terminal of the fourth transistor is connected through the second resistor,
a source terminal of the fifth transistor is connected to a power supply potential,
a gate terminal and a drain terminal of the fifth transistor is shorted and connected to the oscillator,
the gate terminal of the fifth transistor and gate terminal of the third transistor are connected through the sixth switch, the gate terminal of the third transistor is connected to a first terminal applied with a control signal of the semiconductor switching device through the fifth switch, a gate terminal of the fourth transistor is connected to a second terminal applied with the control signal of the semiconductor switching device through the third switch, the fourth switch is connected in series to the second resistor between the gate terminal and the drain terminal of the fourth transistor, and the control circuit sets the third switch and the fifth switch to be in the conducting state and sets the fourth switch and the sixth switch when the first terminal and the second terminal are applied with the control signal for conducting the semiconductor switching device to the first terminal and the second terminal.

19. The electronic circuit according to claim 1, further comprising
the semiconductor switching device.

* * * * *